United States Patent
Correale, Jr. et al.

(10) Patent No.: US 6,335,637 B1
(45) Date of Patent: Jan. 1, 2002

(54) TWO-SUPPLY PROTECTION CIRCUIT

(75) Inventors: Anthony Correale, Jr., Raleigh, NC (US); Terry C. Coughlin, Jr., Endicott, NY (US); David W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/541,196

(22) Filed: Apr. 3, 2000

(51) Int. Cl.$^7$ .................................................. H03K 19/0175
(52) U.S. Cl. ................... 326/80; 326/68; 326/81; 326/56; 327/309
(58) Field of Search .................. 326/56, 80, 81, 326/63, 68; 327/309, 310, 328

(56) References Cited

U.S. PATENT DOCUMENTS

| | | | | |
|---|---|---|---|---|
| 5,136,189 A | * | 8/1992 | Demaris | 326/66 |
| 5,136,191 A | | 8/1992 | Nunogami | 307/475 |
| 5,266,849 A | * | 11/1993 | Kitahara et al. | 326/62 |
| 5,378,943 A | | 1/1995 | Dennard | 326/68 |
| 5,398,000 A | * | 3/1995 | Wu | 326/9 |
| 5,408,147 A | | 4/1995 | Yarbrough et al. | 326/68 |
| 5,512,844 A | | 4/1996 | Nakakura et al. | 326/81 |
| 5,513,140 A | | 4/1996 | Merritt | 365/189.05 |
| 5,631,579 A | | 5/1997 | Miki et al. | 326/58 |
| 5,834,948 A | | 11/1998 | Yoshizaki et al. | 326/81 |
| 5,896,045 A | | 4/1999 | Siegel et al. | 326/81 |
| 5,917,339 A | | 6/1999 | Kim | 326/68 |
| 5,933,025 A | | 8/1999 | Nance et al. | 326/81 |
| 6,107,830 A | * | 8/2000 | Okumura | 326/58 |
| 6,208,167 B1 | * | 3/2001 | Reanjan et al. | 326/81 |

FOREIGN PATENT DOCUMENTS

JP 02254814 A * 10/1990 .................. 326/58

* cited by examiner

Primary Examiner—Michael Tokar
Assistant Examiner—Steven S. Paik
(74) Attorney, Agent, or Firm—Schmeiser, Olsen & Watts; John R. Pivnichny

(57) ABSTRACT

The protection circuit of the present invention addresses the problem of indeterminate logic levels caused by loss of one of the power supplies in a two-power-supply CMOS integrated circuit. The circuit of the present invention replaces the typical scheme of power supply sequencing to fix the problem. The circuit disclosed herein detects the state of the core voltage and disables the output drivers when the core voltage is detected as being off. The disabled drivers are put into a high impedance state, thereby eliminating the potential for damage and eliminating the need for power supply sequencing. The invention also protects against the sudden loss of the integrated circuit core voltage, VDD, power supply during normal operation.

12 Claims, 2 Drawing Sheets

TWO-SUPPLY PROTECTION CIRCUIT

BACKGROUND OF THE INVENTION

1. Technical Field

The present invention relates generally to the field of integrated circuits. In particular, this invention relates to power supplies for integrated circuits and to an improved and simplified method for providing a stable source of power for a complementary metal oxide semiconductor (CMOS) integrated circuit utilizing a split-rail or dual power supply.

2. Related Art

The field of integrated circuitry is a rapidly developing field of technology. Integrated circuits are continually being made smaller with the attendant requirements of increasing both device speed and circuit density. The miniaturized devices built within and upon a semiconductor substrate are spaced very closely together and the integrated circuit density, that is, the number of integrated circuits per unit of surface area, continues to increase significantly. The highest integrated circuit density is achieved using Field Effect Transistors (FETs). A FET is a device having a source, gate, and drain arranged such that when a high logic signal voltage is applied to the gate, current may pass from the source to the drain. Similarly, the FET does not allow current to pass between the source and the drain when a low logic signal is applied to the gate.

As the integrated circuit density increases, the amount of power dissipated by the integrated circuits on the substrate increases proportionally. The amount of power dissipation is a concern because complicated heat sinks and circuit packaging may be required to prevent the chip temperature from rising above its rated operational temperature limit. Further, many devices containing integrated circuits typically operate on stored power. One example is a portable computer operating on battery power. As power dissipation increases, battery life decreases, and the shorter the operational life of the electronic device. Therefore, reducing the power consumption for a given integrated circuit density is important to the design of integrated circuits.

One way to decrease this power consumption is to reduce the voltage at which the circuits operate. However, decreasing the operational voltage level creates a compatibility problem because some integrated circuits are designed to operate at predetermined, specific voltage levels. For example, some circuits may interface with low voltage circuits, and these same circuits may need to operate at higher voltage levels to operate electromechanical devices. Also, there are many existing integrated circuits that cannot have their operating voltage altered, yet, new, lower voltage circuits must interact with them. Therefore, to lower the voltage of integrated circuits to dissipate less power, and still permit interaction with different existing hardware, some form of interface circuit is required.

In general, the related art has provided a variety of interface circuits for translating lower voltage levels into higher voltage logic levels and vice versa. This is because the logic voltage levels implemented in integrated circuits have been generally decreasing.

Many complementary metal oxide semiconductor (CMOS) integrated circuits require more than one power supply per chip. Such designs are known in the art as "split rail designs." For instance, a split rail design is utilized when the internal or core chip voltage, VDD, operates at a different voltage level than the input/output (I/O) interface voltage or output driver voltage, OVDD. The integrated circuit core voltage, VDD, is limited by the integrated circuit technology or power dissipation requirements of the chip and the driver output voltage, OVDD.

Split rail designs create many challenges that must be addressed by both integrated circuit designers and system designers. For a typical split rail integrated circuit to operate properly, both of the power supplies must be in the powered up state. Numerous problems can occur when one supply is off while the other is on. Problems can also occur when the sequence in which the two supplies are powered up or powered down becomes critical.

One example of such a problem occurs when the integrated circuit core voltage, VDD, is in an off state and the output drivers are powered up via the output driver voltage, OVDD. In this situation, the output drivers will have lost all the control signals from the integrated circuit core which are derived from the integrated circuit core voltage, VDD. With no control signals to the drivers, the driver' output stages may try to pull the output pad both up and down at the same time. This scenario is characterized by a high crossover current effect from the output driver voltage, OVDD, to ground, which can be multiplied by hundreds of drivers throughout the chip thereby causing permanent equipment damage.

SUMMARY OF THE INVENTION

The present invention solves these problems in the related art by detecting the state of the core voltage and disabling the output drivers when the core voltage is detected to be off. The disabled drivers are put into a high impedance state, thereby eliminating the potential for damage and eliminating the need for power supply sequencing requirements. The disclosed invention also protects against the sudden loss of the integrated circuit core voltage power supply, VDD, during normal operation.

It is therefore an advantage of the present invention to provide a semiconductor chip comprising: a first plurality of circuits connected to a first voltage contact and a ground contact; a second plurality of circuits connected to a second voltage contact and said ground contact; a disabling circuit connected to said first voltage contact and said second voltage contact, and having an output node, said disabling circuit adapted to operate by pulling said output node to said ground contact only when a second voltage source is connected to said second voltage contact and no voltage source is connected to said first voltage contact; and wherein at least one of said second plurality of circuits is connected to said output node of said disabling circuit and wherein said at least one of said second plurality of circuits is adapted to enter a high impedance state when said output node is pulled to said ground contact.

Another aspect of the invention is to provide a method of protecting circuitry in a semiconductor chip, comprising: providing a first plurality of circuits connected to a first voltage contact and a ground contact; providing a second plurality of circuits connected to a second voltage contact and said ground contact; providing a disabling circuit connected to said first voltage contact and said second voltage contact, and having an output node, said disabling circuit operating by forcing said output node to said ground contact only when a second voltage source is connected to said second voltage contact and no voltage source is connected to said first voltage contact; connecting at least one of said second plurality of circuits to said output node of said disabling circuit.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE INVENTION

Figure 1:
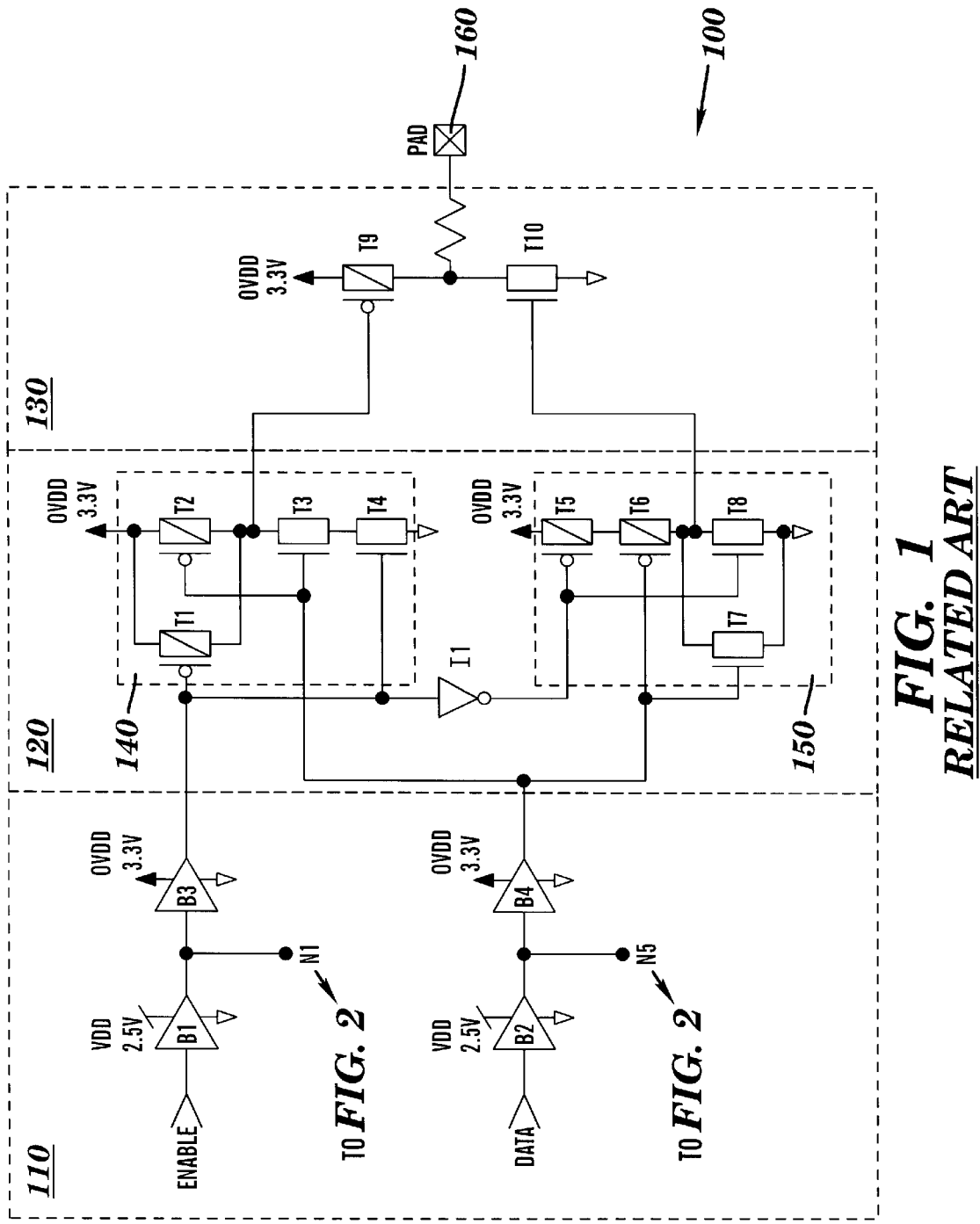
FIG. 1 depicts a schematic diagram of a typical level-shifting CMOS output driver circuit of the related art.

Referring to the drawings, FIG. 1 illustrates an example of the related art problem discussed supra. The driver circuit 100 shown in FIG. 1 illustrates a typical two-power-supply level-shifting CMOS output driver circuit. The driver circuit 100 includes an input stage 110, a pre-drive stage 120, and an output stage 130. The internal integrated circuit core voltage, VDD, is nominally about 2.5 volts, and the output driver voltage, OVDD, is nominally about 3.3 volts. A first input, labeled DATA, is the driver input and a second input, labeled ENABLE, is used to switch the output stage 130 into a high impedance state. Under normal operation, 2.5 volt logic data from the integrated circuit core is present at the DATA and ENABLE inputs to the driver circuit 100. Buffers B1 and B2 pass the data to buffers B3 and B4, respectively, which convert, or level shift, the 2.5 volt logic to 3.3 volt logic. From this point, the remaining circuitry is a typical 3.3 volt driver consisting of the pre-drive stage 120 and the output stage 130. The pre-drive stage 120 is a NAND/NOR pre-drive used to control the rate of change of the driver output current (di/dt).

In operation, when the 3.3 volt supply, OVDD, powers up before the 2.5 volt supply, VDD, or when there is a sudden loss of the 2.5 volt supply, VDD, during otherwise normal operation, the logic levels at the inputs, DATA, ENABLE, to the driver circuit 100 become indeterminate. Because the driver circuit 100 output devices, transistor T9 and transistor T10, are powered by the 3.3 volt supply, the driver circuit 100 is capable of supplying current from 3.3 volts to ground through transistor T9 and transistor T10.

According to the present invention, a novel method of preventing the inputs (DATA, ENABLE) to the driver circuit 100 from becoming indeterminate involves detecting the loss of the 2.5 volt supply and forcing a logic zero at nodes N1 and N5. A logic zero at nodes N1 and N5 is a valid input to buffers B3 and B4, respectively, which are powered by the 3.3 volt supply while it is still active. The outputs of buffers B3 and B4 are also at a logic zero, or ground potential, which is passed to the NAND/NOR pre-drive stage 120. Transistors T1, T2, T3, and T4 form the NAND gate 140 of the pre-drive stage 120 that controls the output P-channel field effect transistor (PFET) T9. A zero logic level at the gates of transistor T1 and transistor T4 forces the output of the NAND gate 140 to 3.3 volts at the gate of transistor T9, independent of the indeterminate voltage at the gates of transistor T2 and transistor T3. The 3.3 volt level at the gate of transistor T9 shuts off the output PFET transistor T9 thus preventing any current through this device.

The forced-zero logic level at the outputs of buffers B3 and B4 is also fed to the NOR gate 150 of the pre-drive 120, comprising transistors T5, T6, T7, and T8, through inverter I1. Since inverter I1 is powered from the 3.3 volt supply, this forces a 3.3 volt (high) logic level to the gates of transistors T5 and T8. This in turn forces the output of the NOR gate 150 to ground, independent of the indeterminate voltage at the gates of transistor T6 and transistor T7. The gate of transistor T10 is at ground potential, which turns off transistor T10, preventing any current flow through this device. Because transistors T9 and T10 are both turned off, the driver circuit 100 is in a true high impedance state, preventing any crossover current from the 3.3 volt supply, OVDD, to ground, or from the signal connection pad (PAD) 160 to ground, or from the 3.3 volt supply, OVDD, to PAD 160.

Figure 2:
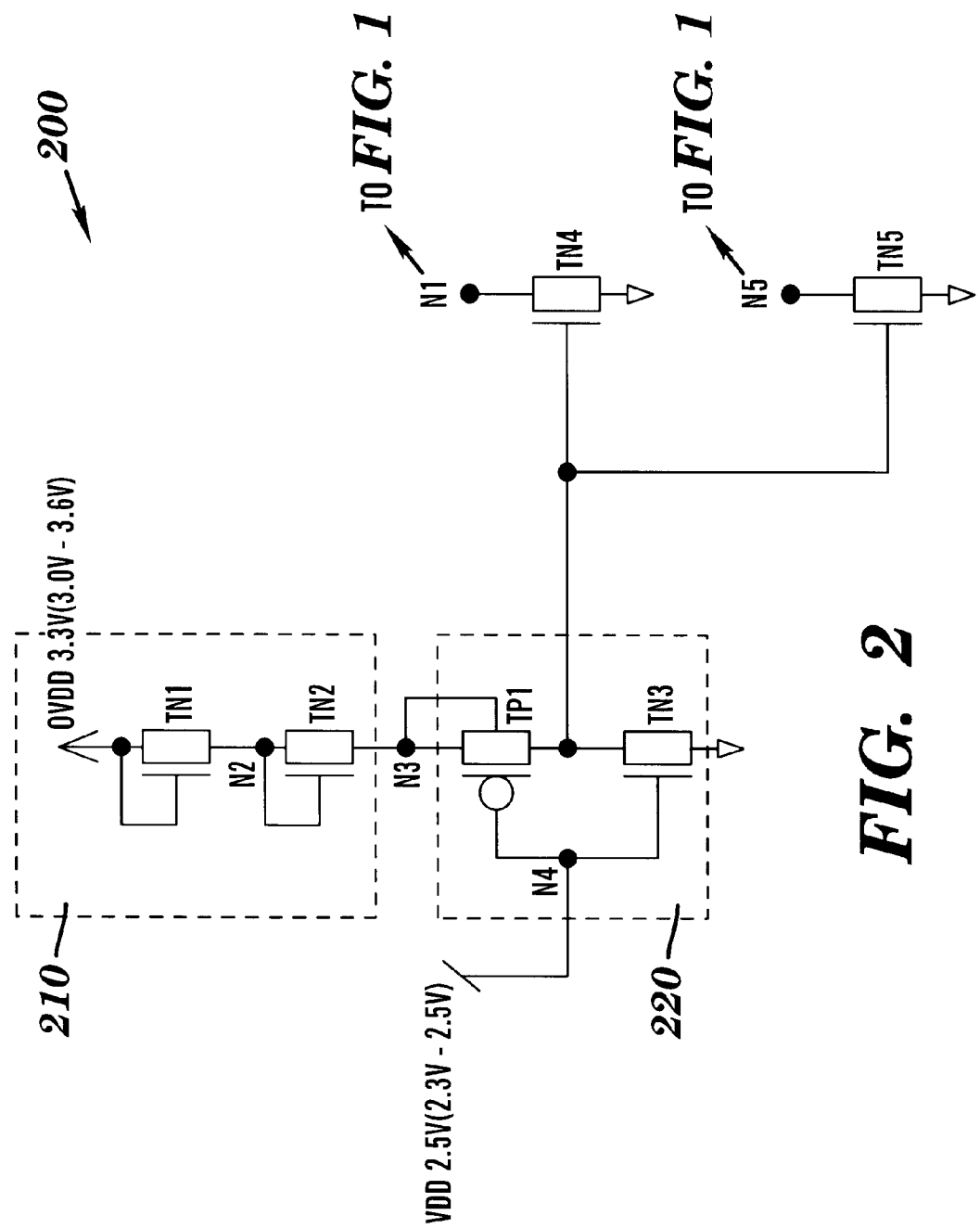
FIG. 2 depicts a schematic diagram of an input/output (I/O) protection circuit for detecting the loss of the VDD voltage supply in accordance with a preferred embodiment of the present invention.

FIG. 2 shows the I/O protection circuit 200, for loss of VDD, of the present invention that detects the loss of the 2.5 volt supply, VDD, and forces the nodes N1 and N5 to a logic zero or ground potential. The protection circuit 200 of FIG. 2 operates as follows. Transistors TN1 and TN2 are two diode-connected N-channel FETs (NFETs). The function of transistors TN1 and TN2 is to lower the maximum voltage at node N3 from OVDD to a voltage level less than or equal to VDD. This will ensure that transistor TP1 is off when the gate of TP1 is held at VDD. The N-well of transistor TP1 is also tied to node N3.

In the normal functioning mode, VDD is powered up. In this case, transistors TP1 and TN3 form an inverter with its input or gates tied to VDD. When VDD is powered up, the input to the inverter is high, which forces transistor TP1 off and transistor TN3 on. Transistor TN3 pulls down the gates of transistors TN4 and TN5 thereby shutting off TN4 and TN5. With TN4 and TN5 off, nodes N1 and N5 float and have no effect on the driver circuit 100 shown in FIG. 1.

In the failure mode, wherein the VDD supply either drops to ground or fails to turn on, the input to the inverter stage 220 formed by TP1 and TN3 is at ground. This turns off transistor TN3, and turns on transistor TP1, pulling up the gates of transistors TN4 and TN5 to the voltage level at node N3. This turns on transistors TN4 and TN5, pulling down nodes N1 and N5, and forcing the driver circuit 100 to a high impedance state as described in the description of the driver circuit 100 of FIG. 1.

Note that the effect of transistor TN4 pulling down node N1 is sufficient, by itself and without the application of TN5, to force the driver circuit 100 to a high impedance state. Also, the effect of transistor TN5 pulling down node N5 is to force the input of buffer B4 to a stable state at logic zero when the loss of the 2.5 volt supply is detected. This condition (i.e., wherein buffer B4 is in a stable state at logic zero) will prevent buffer B4 from floating, which would cause unnecessary power dissipation in buffer B4.

This protection circuit 200 (FIG. 2) dissipates zero DC power because node N3 is kept below the minimum VDD voltage level. More or fewer diode connected NFETs may be used depending on the range of voltage for VDD and OVDD. The protection circuit 200 illustrated in FIG. 2 describes the preferred embodiment of the invention for a nominal VDD value of about 2.5 volts and a nominal OVDD value of about 3.3 volts. Slight modifications can be made to this protection circuit 200 to accommodate higher or lower values of VDD and OVDD by adding or subtracting the number of diode-connected NFETs, shown here as TN1 and TN2 in FIG. 2.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor chip, comprising:

a first plurality of circuits connected to a first voltage contact and a ground contact;

a second plurality of circuits connected to a second voltage contact and said ground contact;

a disabling circuit connected to said first voltage contact and said second voltage contact, and having an output node, said disabling circuit adapted to operate by pulling said output node to said ground contact only when a second voltage source is connected to said second voltage contact and no voltage source is connected to said first voltage contact; and wherein at least one of said second plurality of circuits is connected to said output node of said disabling circuit and wherein said at least one of said second plurality of circuits is adapted to enter a high impedance state when said output node is pulled to said ground contact.

2. The semiconductor chip of claim 1, wherein the first and second plurality of circuits are implemented with complementary metal oxide semiconductor (CMOS) transistors.

3. The semiconductor chip of claim 1, wherein the first voltage contact is at a nominal voltage of about 2.5 volts.

4. The semiconductor chip of claim 1, wherein the second voltage contact is at a nominal voltage of about 3.3 volts.

5. A semiconductor interface circuit for translating lower voltage logic levels into higher voltage logic levels and vice versa, comprising:

a first voltage contact;

a second voltage contact;

a ground contact;

a sensing circuit which monitors the voltage levels at the first and second voltage contacts; and a disabling circuit having an output node, and adapted to force said output node to ground potential at the ground contact, only when a second voltage source is connected to said second voltage contact and no voltage source is connected to said first voltage contact; and wherein the semiconductor interface circuit is adapted to enter a high impedance state when said output node is pulled to said ground potential at the ground contact.

6. A method of protecting circuitry in a semiconductor chip, comprising:

providing a first plurality of circuits connected to a first voltage contact and a ground contact;

providing a second plurality of circuits connected to a second voltage contact and said ground contact;

providing a disabling circuit connected to said first voltage contact and said second voltage contact, and having an output node, said disabling circuit operating by forcing said output node to said ground contact only when a second voltage source is connected to said second voltage contact and no voltage source is connected to said first voltage contact; and connecting at least one of said second plurality of circuits to said output node of said disabling circuit.

7. The method of claim 6, further comprising the step of:

adapting at least one of said second plurality of circuits to enter a high impedance state when said output node is pulled to said ground contact.

8. A two-supply input/output protection circuit comprising:

a driver input stage having a data input and an enable input;

a disabling stage having a pre-drive stage comprising a NAND gate and a NOR gate, said disabling stage operationally connected to an output of said input stage;

an output stage operationally connected to an output of the pre-drive stage; and a sensing stage having an inverter stage and a voltage drop stage, said sensing stage operationally connected to said input stage, and said inverter stage operationally connected to said voltage drop stage.

9. The protection circuit of claim 8, said inverter stage further comprising:

a first transistor, said first transistor being a p-channel field effect transistor (PFET); and a second transistor, said second transistor being an n-channel field effect transistor (NFET).

10. The protection circuit of claim 8, wherein the voltage drop stage comprises a plurality of diode-connected transistors.

11. The protection circuit of claim 8, wherein the voltage drop stage provides a voltage drop so that the voltage level at the output of the voltage drop stage is less than a minimum value of the input to the inverter stage.

12. The protection circuit of claim 8, wherein the output stage is switchable to a high impedance state.

* * * * *

UNITED STATES PATENT AND TRADEMARK OFFICE
CERTIFICATE OF CORRECTION

PATENT NO.    : 6,335,637 B1
DATED         : January 1, 2002
INVENTOR(S)   : Correale, Jr. et al.

It is certified that error appears in the above-identified patent and that said Letters Patent is hereby corrected as shown below:

Column 5,
Line 3, insert -- having a first voltage source -- between the words "contact" and "and".
Line 4, insert -- having a first voltage source -- after the word "contact".
Line 8, delete "adapted to operate" and replace with -- operating --.
Lines 9 and 10, delete "adapted to force" and replace with -- forcing --.
Lines 14 and 15, delete "adapted to enter" and replace with -- entering --.
Line 16, delete "adapted to enter" and replace with -- entering --.

Column 6,
Line 4, insert -- having a first voltage source -- between the words "contact" and "and".

Signed and Sealed this

Thirtieth Day of July, 2002

*Attest:*

JAMES E. ROGAN
*Director of the United States Patent and Trademark Office*

*Attesting Officer*

UNITED STATES PATENT AND TRADEMARK OFFICE
CERTIFICATE OF CORRECTION

PATENT NO.     : 6,335,637 B1
DATED          : January 1, 2002
INVENTOR(S)    : Correale, Jr. et al.

It is certified that error appears in the above-identified patent and that said Letters Patent is hereby corrected as shown below:

Title page,
Item [75], Inventor, "David W. Stout" should read -- Douglas W. Stout --.

Column 5,
Lines 10 and 37, after "contact" should read -- having a first voltage source --.
Line 15, "adapted to operate" should read -- operating --.
Lines 24 and 48, "adapted to enter" should read -- entering --.
Lines 43-44, "adapted to force" should read -- forcing --.

Column 6,
Line 4, after "and" should read -- having --.

Signed and Sealed this

Thirtieth Day of December, 2003

JAMES E. ROGAN
*Director of the United States Patent and Trademark Office*